United States Patent [19]
Worst

[11] 3,980,935
[45] Sept. 14, 1976

[54] VOLATILE MEMORY SUPPORT SYSTEM

[76] Inventor: Bernard I. Worst, 6 Burnham Place, Flanders, N.J. 07836

[22] Filed: Dec. 16, 1974

[21] Appl. No.: 532,867

[52] U.S. Cl. .................. 340/173 R; 340/173 DR
[51] Int. Cl.² .................................. G11C 11/40
[58] Field of Search ..... 340/173 R, 173 LI, 173 CP, 340/173 DR; 307/126

[56] References Cited
UNITED STATES PATENTS

| | | | |
|---|---|---|---|
| 3,859,638 | 1/1975 | Hume | 340/173 R |
| 3,870,901 | 3/1975 | Smith | 340/173 R |

*Primary Examiner*—Terrell W. Fears

[57] ABSTRACT

An automatic support system for a volatile memory which provides maintenance voltages to such memory upon the interruption of normal operating voltages and which permits the intentional termination of operating voltages with the provision of maintenance voltages. The main power inputs for the memory are applied simultaneously to a primary power supply and secondary supply, the secondary supply providing the required memory maintenance voltages. In addition a battery supply is provided as backup for main power failure. A voltage regulator controlled by an electronic power switch is operative to provide the necessary maintenance voltage to the memory making use of the available supplies in a preferential order of primary, secondary power supply and battery supply.

6 Claims, 3 Drawing Figures

VOLATILE MEMORY SUPPORT SYSTEM

BACKGROUND OF THE INVENTION

The invention is directed to the field of data processing and more particularly to memory devices for use in and with data processing equipment. Memory devices may be broken down into two types by their storage characteristics, namely, stable (non-volitile) or volitile. A stable storage device is one which retains its data until the device is erased or written over and is uneffected by the presence or absence of system operating or maintenance voltages. For example, a magnetic drum memory stores data by the recording at discrete spots on the surface of the drum. The drum retains such a recording regardless of the rotation or non-rotation of the drum and the presence or absence of power to the associated data processor.

A volitile storage device is one which retains its storage state only so long as the device is operational. For example, if transistor flip-flops are used as the storage device they will retain their storage condition only so long as the required operating voltages are applied. In the event of a power failure, the removal of operating voltages would destroy the stored value since the resumption of the correct storage state could not be assured when the power was restored.

DESCRIPTION OF THE PRIOR ART

Because of the greater switching speeds available from volitile memories in addition to their higher densities and reduced size and rapid access to the data stored therein, efforts have been made to overcome the severe limitations of data loss due to power interruption. These prior art approaches have generally required a great deal of additional circuitry to remember the state of the memory unit when power was interrupted and have at times required the inclusion of additional power supplies whose outputs were channeled to the memory device based upon its state when the power was removed.

One such device achieved a retentive memory function by supplying inputs to the memory through a bistable state reed relay which causes the bistable state of the memory to correspond to the bistable state of the reed relay when power to the memory is initiated and supplying the outputs of the memory to the inputs of the reed relay which causes the bistable state of the reed relay to correspond to the bistable state of the memory when power to the memory is interrupted. Another device provides a pair of half-wave magnetic amplifiers to sense the state of a bistable memory and cause the bistable memory to retain the last state it occupied before the power failure. A further prior art device provides a pair of rechargeable batteries as a standby power source and switching circuitry to supply power only to the active state of a bistable memory device when primary power is interrupted.

SUMMARY OF THE INVENTION

The invention herein described overcomes the difficulties noted above with respect to prior art devices by providing a protective system which can supply sufficient voltages to maintain the state of a bistable storage device despite the interruption of the main power supply due to failure and which in addition permits the interruption of the main power supply at will in order to prevent the unnecessary wasting of power when the memory system is not in active use.

The volitile memory protected by the present invention is of the type which employs transistor flip-flops for the storage of data, one transistor conducting to show the storage of a "zero" and the other conducting to show the storage of a "one." The transistors are operated in a dual current mode such that a first low current state the transistor maintains its present set or reset state and cannot be changed therefrom and a second or higher conduction state during which the flip-flop state can be changed by proper triggering signals. The voltage applied to permit the low conduction state is termed the maintenance voltage (V-maint) and is less than the voltage applied to permit the higher conduction state and switching to take place termined the operating voltage (V-oper). Memories of this type are well known, for example, Intel Memory I2102 and Advanced Micro Device Memory - 9102.

The main A.C. supply is applied through a power switch to a primary power supply and directly to a secondary power supply. The outputs of the primary and secondary power supplies and the output of a standby rechargeable battery are all fed to a voltage regulator and switch which controls the application of maintenance voltages to the memory. With the primary power supply operating all system voltages are available including the operating voltage (V-oper) for the memory. In the event of a failure of the primary power supply, the secondary power supply provides the memory with maintenance voltages (V-maint). Also, during those times when the memory is not in use, the life of the system can be extended as well as decreasing the power consumed by switching from V-oper to V-maint simply by opening the main power switch. However, should the failure of the primary system be due to a failure of the main A.C. power source, the standby batteries immediately supply the required maintenance voltages (V-maint). The voltage regulator insures firstly that power consumed by the system from the battery and from the secondary supply in the case of a power failure is minimized and also that the proper voltage for memory maintenance will be applied regardless of which supply is switched into operation. It is an object of this invention to provide a support system for a volitile memory.

It is another object of this invention to provide a multiple source system selectively applied to a volitile memory to protect its storage contents during power interruptions.

It is yet another object of this invention to provide a volitile memory support system which can be partially shut down during periods of nonuse to reduce power consumption.

It is still another object of this invention to provide an automatically operable support system for a volitile memory which preserves its stored information despite power interruptions.

Other objects and features of the invention will be pointed out in the following description and claims and illustrated in the accompanying drawings, which disclose, by way of example, the principles of the invention and the best mode which has been contemplated for carrying it out.

DESCRIPTION OF THE PREFERRED EMBODIMENT

Figure 1:
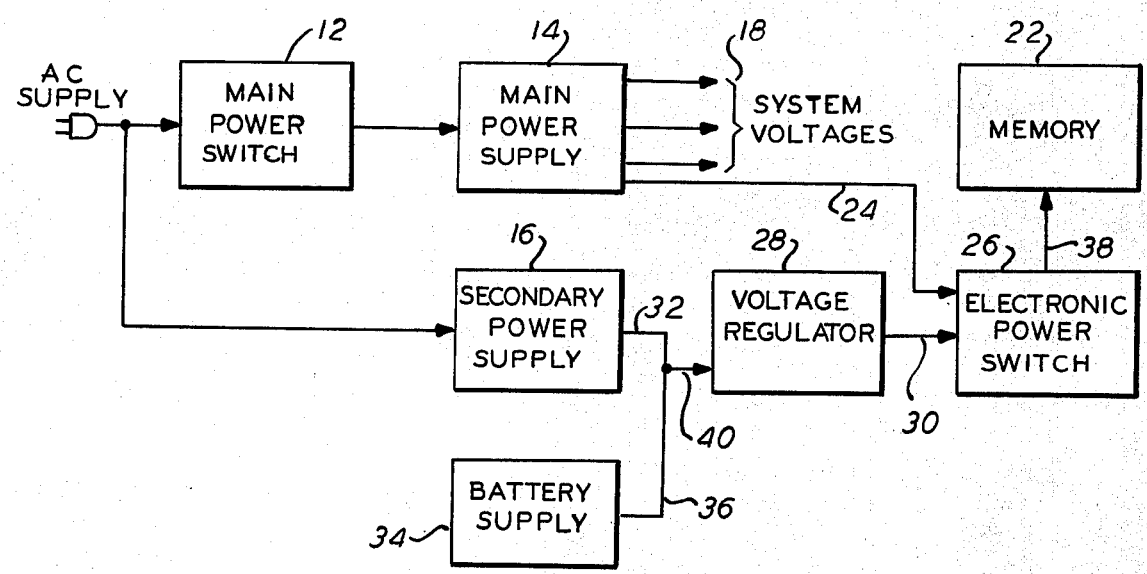
FIG. 1 is a block diagram of a volatile memory support system constructed in accordance with the concepts of the invention.

Turning now to FIG. 1, there is shown a volatile memory support system 10 constructed in accordance with the concepts of the invention. The main A.C. supply is applied in parallel through a main power switch 12 to a primary power supply 14 and directly to a secondary power supply 16. The main power supply 14 and secondary power supply 16 may be constructed in accordance with well known teachings of the prior art and may consist of a transformer the primary of which is connected to the A.C. supply and whole secondary has various taps to provide the range of system voltages 18 required. Rectifiers and filters are provided as are regulators to insure the quality of the voltages available. Line 38 indicates the memory operating voltage (V-oper) provided to volatile memory 22 through the electronic power switch. The electronic power switch is completely automatic in sensing loss of operating voltage and switching to the maintainence voltage. When primary power supply 14 is not operating, either due to a failure of the supply 14 itself, or the A.C. supply or due to the operation of main power switch 12 when the memory operation is not needed, the electronic power switch 26 permits the application of the maintenance voltage (V-maint) to memory 22 in a manner to be described below.

A voltage regulator 28 is coupled to the electronic power switch 26 via line 30, to the secondary power supply 16 via line 32 and 40 and to a battery supply 34 via line 36 and 40. The output of the voltage regulator 28 is applied via electronic power switch 26 to memory 22 via line 38. The voltage on line 30 is the maintenance voltage (V-maint) and is present at all times.

Figure 3:
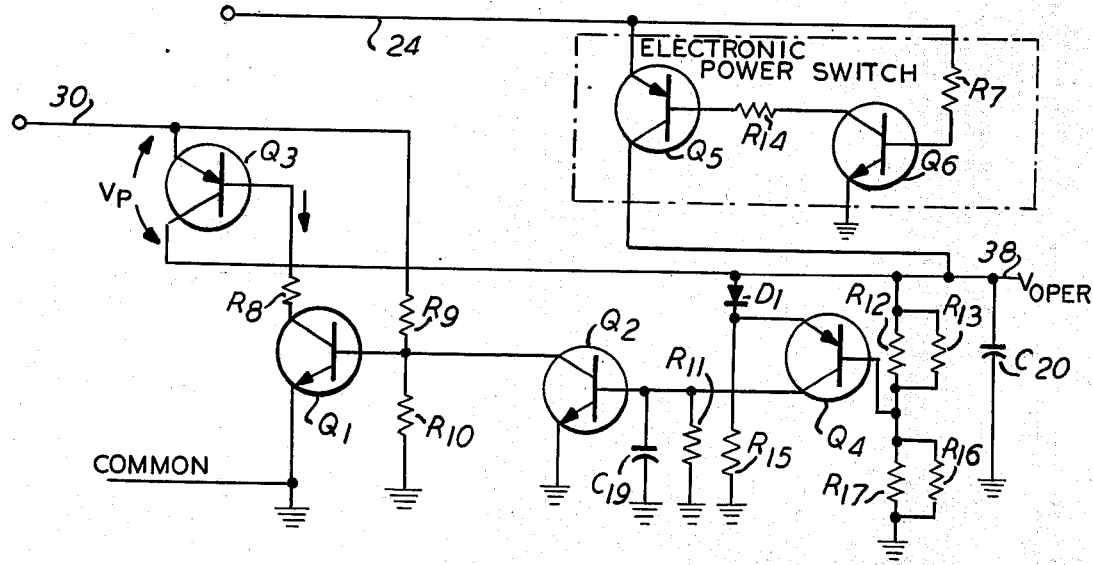
FIG. 3 is a schematic diagram of the voltage regulator and electronic power switch of FIG. 1.

As will be apparent from the description of FIG. 3, the preferred mode of operation is with primary power supply 14 operating and providing the system voltages 18 including the operating voltage (V-oper) to memory 22 through the electronic power switch 26. It will be appreciated that the regulator controls the current drawn from the battery and the secondary supply in the case of power failure and keeps it at a predetermined minimum value. If the regulator were not present the maximum current would be drawn from the battery by the system. This would continue until the battery reached a level at which the voltage could not maintain the stored data. This would cause loss of the data. By having a regulator the current drawn could be kept at the minimum level and thus maintain the stored data for a longer period of time.

When primary power supply 14 is interrupted by failure or choice as when main power switch 12 is opened, the support system 10 seeks to maintain memory 22 by providing maintenance voltages (V-maint) from secondary power supply 16 and failing this, from battery supply 34. The battery can be maintained in a fully charged condition by a trickle charge technique employing current provided from secondary power supply 16.

Figure 2:
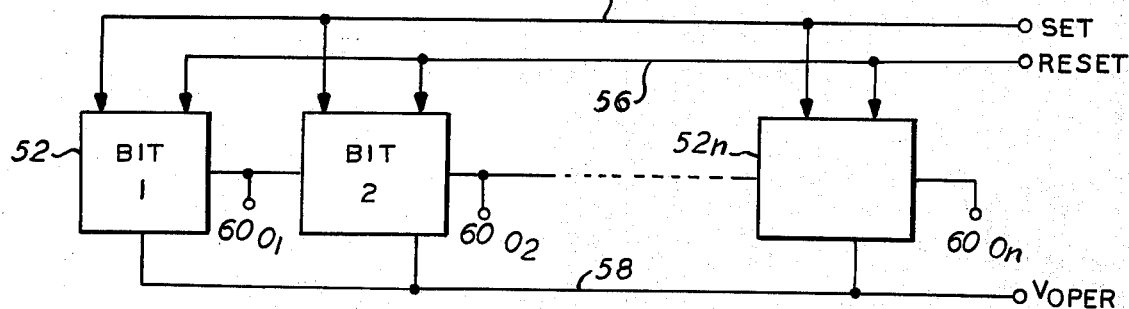
FIG. 2 is a block diagram of the volatile memory of FIG. 1.

Referring now to FIG. 2, a volatile memory of the type referred to above, is shown in block diagram. A plurality of stages 52, 1, 2 ... n are shown. Each stage 52 is transistor flip flop able to store one bit of information coded in the well-known binary code. The transistors may be discrete components and intergrated circuits together with all required interconnections. Each state 52 is coupled to a set line 54 and a reset line 56 (by well known addressing means) which can be used to set each stage to its "zero" or "one" state providing the operating voltage (Voper) is applied to line 58 at the same time as above described. Each stage 52 has an output terminal 60, $0_1$, $0_2$ ... $0_N$ upon which an output A0 to N0 may be available.

Turning now to FIG. 3 the electronic power switch 26 and voltage regulator 28 are shown schematically. The operating voltage on line 24 is fed to the emitter of PNP Transistor Q5 whose base is coupled via resistor R14 to the collector of NPN transistor Q6. The collector of transistor Q5 is coupled to line 38 to provide memory 22 with V-oper to supply operating voltage when the main power supply is on. Transistors Q5 and Q6 and resistors R14 and R7 form the electronic power switch. When the main power supply on line 24 is for example 5.0 volts, current is supplied to Q6 which in turn causes Q6 to conduct. This causes Q5 to conduct, allowing almost the full voltage to appear on line 38. It is the full voltage minus the voltage lost in Q5 which is negligible, for example about 0.2 volts. This is the operating voltage to the memory (V-oper).

When the main power supply is off or fails, there is no voltage applied along line 24 and consequently no current supplied to Q6 and Q5 causing both of these transistors to turn off.

At this point the regulator 28 functions to control the inputs from the battery and secondary power supply so that the voltage along line 38 is the desired maintainence voltage, (V-maint). This is a conventional series pass regulator circuit and operates as follows: Q3 is the series pass transistor, (This transistor regulates the voltage so that the voltage input along line 30 from the battery is greater than that needed for V maint and thus this transistor subtracts $V_P$ from the voltage on line 30 to achieve V maint). In other words, to cause this regulating effect, pass transistor Q3 is maintained at VP, its desired voltage by the action of the transistors Q2 and Q1, resistor R8, R9 and R10. The conduction of Q4 will cause a current to flow through R11 and set up a quiescent condition of Q1, Q2 and Q3 to produce the necessary voltage VP of the regulator. Q4 is placed in a conduction state by the flow of current through $D_1$ and $R_{15}$ and resistor pairs $R_{12}$, $R_{13}$ and $R_{16}$ and $R_{17}$. $C_{19}$ and $C_{20}$ are filtering capacitors to prevent oscillations of the circuit.

Any change of battery voltage on line 30 and consequently a change in V-maint on line 38 will result in a change in voltage at the junction of resistor pairs R12, R13 and R16, R17. This voltage change causes a corresponding change in the conduction state of Q4. This will cause a current flow to adjust the conduction states of Q1, Q2 and Q3 which will result in reestablishing VP, to maintain V maint on line 38 at the prescribed value.

It should be appreciated that the values given are for illustration only and are not intended to limit the teachings contained herein in any manner.

While specific embodiments of the invention have been described it will be appreciated that the invention is not limited thereto as many modifications thereof may be made by one skilled in the art which falls within the true spirit and scope of the invention.

I claim:

1. A volitile memory support system for use with a volitile memory requiring a maintenance voltage to retain its bistable state and an operating voltage to permit it to alter its bistable state, said support system comprising: a primary power supply capable of providing system-operating voltages including said operating voltage coupled to said volitile memory; a secondary power supply capable of providing said maintenance voltage; a battery supply capable of providing said memory maintenance voltage; and switching means coupled to said secondary power supply, said battery supply and said memory to provide said memory with said maintenance voltage when said operating voltages are not being applied to said memory.

2. A volitile memory support system as defined in claim 1, wherein said primary power supply is coupled to said switching means to provide an inhibitory signal to said switching means to prevent said switching means from applying said maintenance voltage to said memory when said primary power supply is operating.

3. A volitile memory support system as defined in claim 1 further comprising a regulator means coupled at its inputs to said secondary power supply and said battery supply and at its output to said switch means to provide said switch means with a regulated voltage without respect to the source of the voltage to said regulator means.

4. A volitile memory support system as defined in claim 3, wherein said primary power supply is coupled to said switching means to provide an inhibitory signal to said switching means to prevent said switching means from applying said maintenance voltage to said memory when said primary power supply is operating.

5. A volitile memory support system as defined in claim 1, further comprising main power switch means coupled between the inputs to said primary power supply and a source of voltage; said secondary power supply being coupled directly to said source of voltage whereby the supply to said primary power supply may be selectively applied or removed without alternation of the voltage aupplied to said secondary power supply.

6. A volitile memory support system as defined in claim 1, further comprising: coupling means between said secondary power supply and said battery supply to maintain said battery supply fully charged.

* * * * *